United States Patent
Nagami

(10) Patent No.: US 8,177,312 B2
(45) Date of Patent: May 15, 2012

(54) MONITOR OPENING AND CLOSING MECHANISM

(75) Inventor: Tetsuro Nagami, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 971 days.

(21) Appl. No.: 12/087,416

(22) PCT Filed: Nov. 7, 2006

(86) PCT No.: PCT/JP2006/322174
§ 371 (c)(1), (2), (4) Date: Jul. 3, 2008

(87) PCT Pub. No.: WO2007/102252
PCT Pub. Date: Sep. 13, 2007

(65) Prior Publication Data
US 2009/0015731 A1      Jan. 15, 2009

(30) Foreign Application Priority Data
Mar. 9, 2006   (JP) ................................. 2006-064555

(51) Int. Cl.
*A47B 67/02*   (2006.01)
*A47F 5/08*    (2006.01)
(52) U.S. Cl. ........................................ 312/246; 348/836
(58) Field of Classification Search .......... 348/836–843; 725/74–85; 40/606.15; 312/7.2, 245–248; 361/825
See application file for complete search history.

(56) References Cited

U.S. PATENT DOCUMENTS

| | | | | | |
|---|---|---|---|---|---|
| 4,239,277 | A | * | 12/1980 | Oda | 296/37.12 |
| 4,842,402 | A | * | 6/1989 | Wise | 353/74 |
| 5,847,685 | A | * | 12/1998 | Otsuki | 345/87 |
| 5,985,637 | A | * | 11/1999 | Takegawa et al. | 435/200 |
| 6,340,146 | B1 | | 1/2002 | Tzeng | |
| 6,682,157 | B2 | * | 1/2004 | Ito | 312/319.6 |
| 7,690,611 | B2 | * | 4/2010 | Asamarai et al. | 248/284.1 |

FOREIGN PATENT DOCUMENTS

| | | |
|---|---|---|
| JP | 9-130058 A | 5/1997 |
| JP | 11-213646 A | 8/1999 |
| JP | 11-342798 A | 12/1999 |
| JP | 2001-222232 A | 8/2001 |
| JP | 2004-237895 A | 8/2004 |
| JP | 2004-322749 A | 11/2004 |
| JP | 2006-264664 A | 10/2006 |
| WO | WO-2006/126424 A1 | 11/2006 |

* cited by examiner

*Primary Examiner* — William Gilbert
*Assistant Examiner* — Theodore Adamos
(74) *Attorney, Agent, or Firm* — Birch, Stewart, Kolasch & Birch, LLP.

(57) ABSTRACT

A monitor opening and closing mechanism according to the present invention includes a first guide means guiding a monitor to rotate from home position to a first opened position, and a second guide means guiding the monitor to rotate from the first opened position to a second opened position where the monitor is further opened, wherein the center of rotation about which the second guide means guides the monitor to rotate is disposed more nearly to the side of the home position than the center of rotation about which the first guide means guides the monitor to rotate is disposed.

5 Claims, 12 Drawing Sheets

[First Opened Position]

[Second Opened Position]
[First Opened Position]

[First Opened Position]

[Second Opened Position]

MONITOR OPENING AND CLOSING MECHANISM

TECHNICAL FIELD

The present invention relates to a monitor opening and closing mechanism allowing a monitor mounted on a ceiling of a vehicle, for example, to open and close in such a manner as to open in service and close upon accommodation.

BACKGROUND ART

Conventional monitor hinge mechanisms allowing a monitor mounted on a ceiling of a motor vehicle, e.g., to open and close are arranged to have a support structure where a fulcrum shaft for opening and closing the monitor is fixed in position and the monitor having the shape of a rectangular plate rotates about that fixed support. Such a support structure can condition the monitor to be closed along a mounting surface such as a ceiling in the accommodated state, and further, can condition the monitor to be opened up to a nearly vertical position with respect to the mounting surface such that the monitor can be easily seen by a viewer when used. However, the support structure using such a fixed support occupies a space equivalent to the approximately maximum external shape of the monitor on the side remote from the fixed support in the monitor-opened position. Consequently, the amount of projection of the monitor projecting from the ceiling is large in the case of an in-vehicle monitor suspended from a ceiling, which results in the possibility of obstructing a driver's rearward visibility through a room mirror. Upsizing of a monitor in recent years strengthens that tendency.

Meanwhile, there is a hinge apparatus including two hinges as a means for turning a cover panel of a hand-held computer pocketbook (see Patent Document 1, for instance). In that hinge apparatus, a first hinge acts from the state where the cover panel is closed to the state of a certain panel-opened angle, and a second hinge begins working when the opening angle of the panel exceeded that panel-opened angle. The hinge apparatus has a hinge mechanism where the first hinge operates by a first torque over a certain range, and after exceeding the range, the hinge becomes unable to operate because of being blocked by a restriction force; however, when a second torque larger than the first torque but insufficient to overcome that restriction force is applied, the second hinge operates to cause the cover panel to turn over the range of a second movement.

However, that hinge mechanism controls the switch from the first hinge to the second hinge by the rotating torque, which may cause the second hinge to rotate before the first hinge rotates when force is applied in the direction of shaft axis of a first shaft where the first hinge does not easily rotate, and results in the possibility of breakage of a lock pawl for the cover panel. Further, the cover panel exhibits a rotation mechanism where the panel reverses in such a manner as to surround a bottom panel on the first hinge and the second hinge when rotated, which requires a sufficient thickness for the space where the mechanism moves. This makes the hinge mechanism unsuitable for downsizing the space needed for rotation.

Patent Document 1: JP-A-1997-130058

In a conventional monitor opening and closing mechanism, when a monitor mounted on a ceiling of a motor vehicle is opened to a predetermined position and is seen and listened to by an occupant, a driver's view is obstructed because the monitor projects in a direction where the driver's rearward visibility through a room mirror is obstructed, in an amount remaining as determined by the radius of rotation from the fixed support. Moreover, it is also impossible to say that the hinge mechanism disclosed in Patent Document 1 is suitable for supporting an in-vehicle monitor, as described above. Those mechanisms each have a problem to be solved.

The present invention has been made to solve the above-mentioned problems, and an object of the present invention is to provide an improved monitor opening and closing mechanism that does not restrict a driver's rearward visibility through a room mirror.

DISCLOSURE OF THE INVENTION

The monitor opening and closing mechanism according to the present invention includes: a first guide means guiding a monitor to rotate from home position to a first opened position; and a second guide means guiding the monitor to rotate from the first opened position to a second opened position where the monitor is further opened, wherein the center of rotation about which the second guide means guides the monitor to rotate is disposed nearer to the side of the home position than the center of rotation about which the first guide means guides the monitor to rotate is disposed.

According to the present invention, the position of the center of rotation of the monitor is displaced as the monitor is opened, and the rearward visibility can be enlarged by an amount equivalent to the amount of that displacement.

BEST MODE FOR CARRYING OUT THE INVENTION

Embodiments of the present invention will now be described with reference to the accompanying drawings in order to explain the present invention in more detail.

First Embodiment

Figure 1:
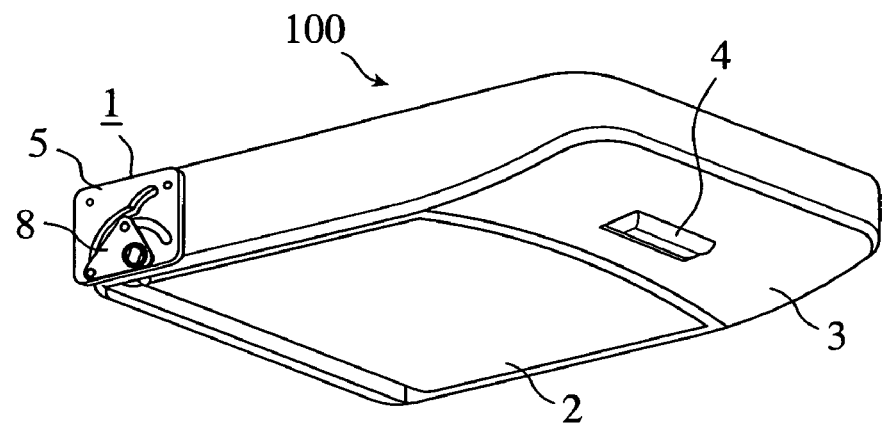
FIG. 1 is a perspective view of an in-vehicle manual suspended-from-ceiling monitor apparatus including a monitor opening and closing mechanism in the monitor accommodated state.
Figure 2:
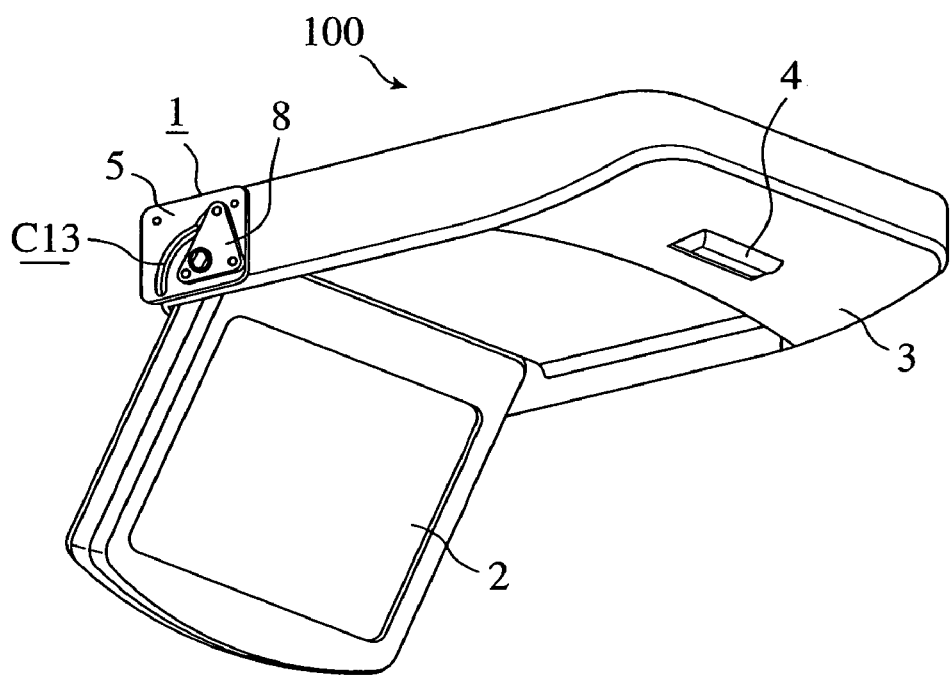
FIG. 2 is a perspective view of the in-vehicle manual suspended-from-ceiling monitor apparatus including the monitor opening and closing mechanism in the monitor opened state.

FIG. 1 and FIG. 2 illustrate an in-vehicle manual suspended-from-ceiling monitor apparatus 100 including a monitor opening and closing mechanism according to the present invention. The monitor apparatus 100 is composed of a monitor 2 and an apparatus body 3 capable of openably and closably holding and accommodating the monitor 2, and the monitor opening and closing mechanism 1 according to the present invention is arranged in the connection section between the monitor 2 and the apparatus body 3.

FIG. 1 illustrates the monitor apparatus 100 in a state secured to a ceiling of a vehicle. The monitor 2 is usually housed within the apparatus body 3 as shown in the figure. The position where the monitor is accommodated therewithin is referred to as home position. A button 4 provided on the apparatus body 3 is pushed to thus cause a lock (not shown) holding the monitor 2 to disengage, and thereby, the monitor 2 is rotated to an angle with its one-end side as the fulcrum by its self-weight to enter an opened state. The monitor can be rotated to a predetermined angle suitable for a user to see and listen, or view to the monitor when it is manually pushed and moved further from the opened state by a user. As shown in FIG. 2, the user enjoys images on the monitor 2 at an angle suitable for seeing and listening.

Figure 6:
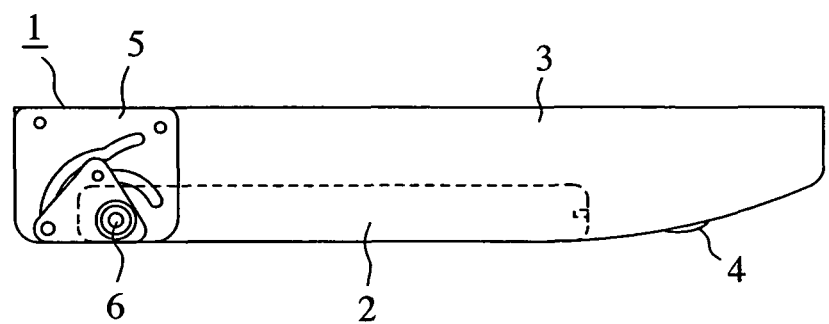
FIG. 6(a) is a front view of the apparatus body accommodating the monitor.
FIG. 6(b) is a front view showing in an enlarged manner the monitor opening and closing mechanism in FIG. 6(a).
Figure 6:
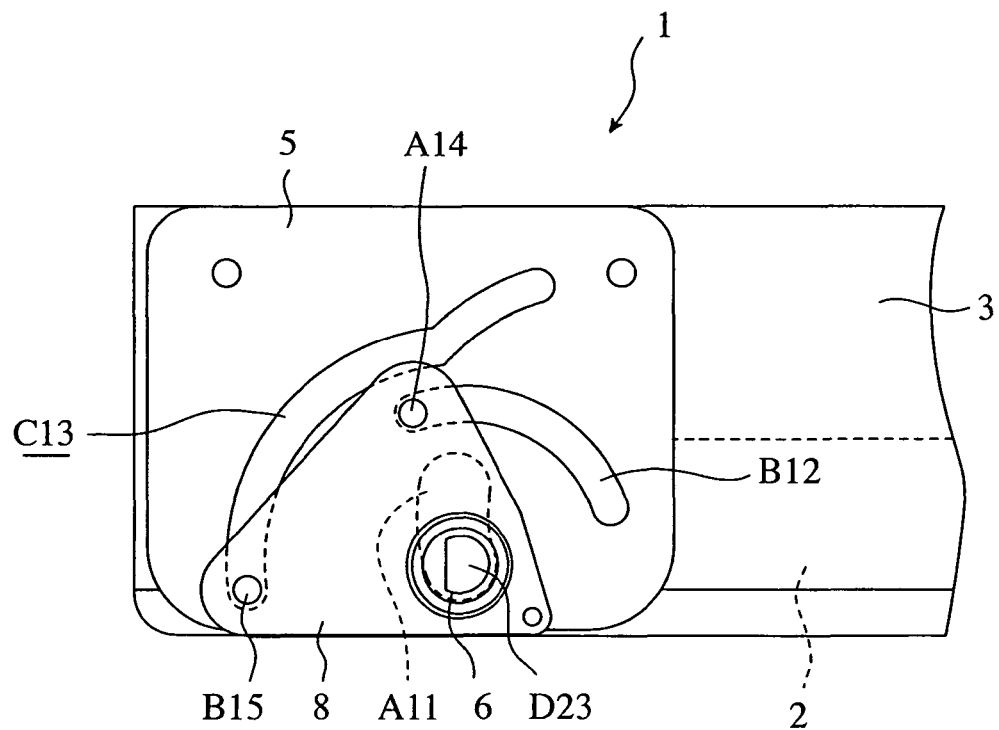

Since a reproducing unit, an interface substrate, and so on (not shown) are provided in the apparatus body 3, the monitor 2 is preferably disposed so as to be located as near as possible to the surface side of the apparatus body 3 in the accommodated state. Usually, the monitor 2 is placed in the accommodated state housed in the monitor apparatus 100 as shown in FIG. 1; upon viewing of the image, the monitor is rotated to be opened and is placed in the opened state as shown in FIG. 2; and after seeing and listening, the monitor is returned to the home position (accommodated state) as shown in FIG. 1, FIG. 6, or the like.

Figure 3:
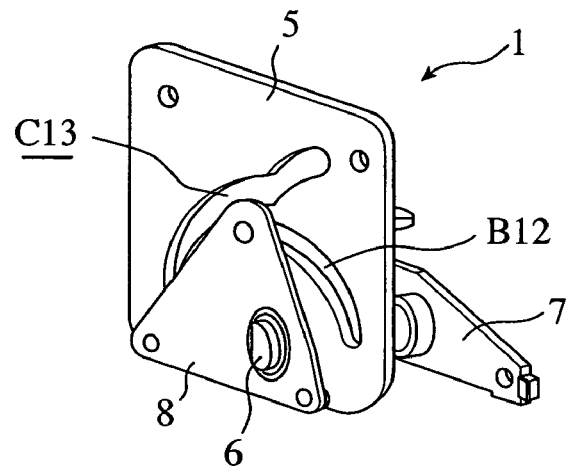
FIG. 3 is a perspective view showing the principal part of the monitor opening and closing mechanism in the assembled state.
Figure 4:
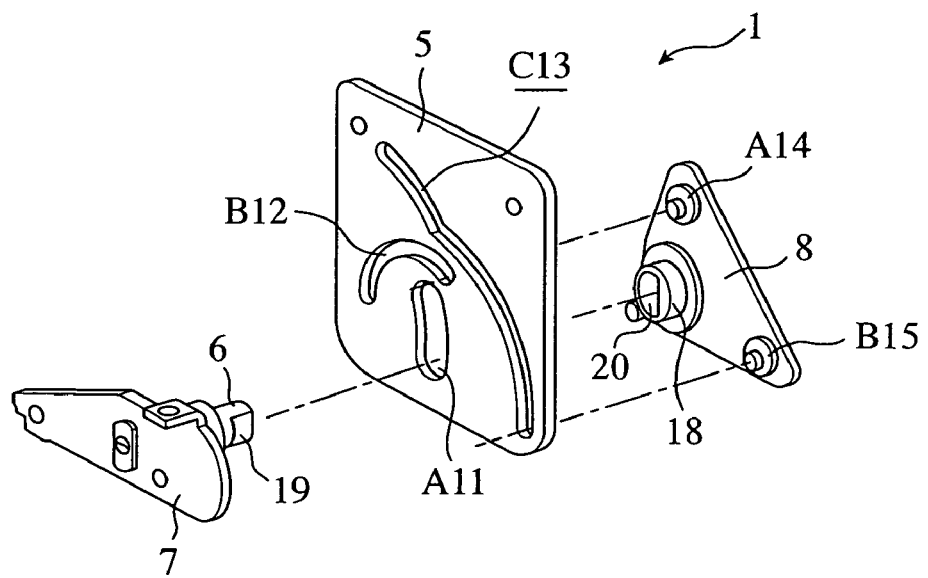
FIG. 4 is an exploded perspective view of the monitor opening and closing mechanism.
Figure 5:
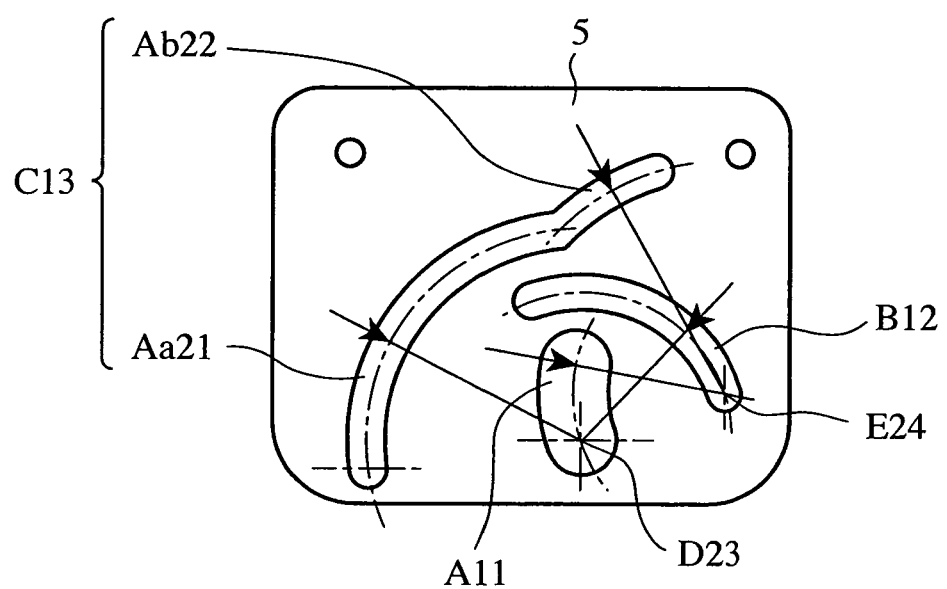
FIG. 5 is a front view of a base thereof.

FIG. 3 is an perspective view showing the principal part of the monitor opening and closing mechanism 1 in the assembled state, and FIG. 4 illustrates the monitor opening and closing mechanism 1 in a disassembled state. Further, FIG. 5 shows a plate-shaped base 5 to which each of parts constituting the monitor opening and closing mechanism 1 is assembled. The structure of the monitor opening and closing mechanism 1 will be described by referring to FIGS. 1, 3, 4, and 5 hereinbelow.

The monitor opening and closing mechanism 1 is secured to the apparatus body 3 as shown in FIG. 1, and as shown in FIG. 4, the monitor 2 is secured to a monitor base 7 formed integral with a shaft 6 provided with a D cut 19. The shaft 6 is passed through an arcuate groove A11 formed through the base 5, and is fixed to a plate shaft 18 secured to a plate 8 on the penetrated side. Note that the base 5 is provided with an arcuate groove B12 and an arcuate groove C13 in addition to the arcuate groove A11.

The plate shaft 18 is provided with a D-shaped hole 20 of the same shape as that of the D cut 19 of the shaft 6, and the D cut 19 is fitted in the D-shaped hole 20 to cause the monitor base 7 and the plate 8 to unitarily rotate. The plate 8 is provided with a convexly shaped plate projection A14 and plate projection B15 that slidably engage the arcuate groove B12 and the arcuate groove C13, respectively, and the movement of the plate 8 is regulated by those arcuate grooves formed through the base 5 by virtue of those engagements.

As shown in FIG. 5, the arcuate groove A11 has the shape of an arc having a length in a vertical direction. The arcuate groove C13 is composed of an arcuate groove Aa21 formed with an arc datum point D23 (corresponding to the axis of the shaft 6 when the shaft is positioned at the lower end of the arcuate groove A11) located in the lower part of the arcuate groove A11 as the center and an arcuate groove Ab22 formed with the arc terminating point E24 (corresponding to the center of the plate projection A14 when the plate projection is located at the arc terminal of the arcuate groove B12) of the arcuate groove B12 as the center, and those arcuate groove Aa21 and arcuate groove Ab22 communicate with each other for allowing the plate projection B15 to move. The arcuate groove B12 is formed with the arc datum point D23 as the center, as well as the arcuate groove Aa21. Furthermore, the base arcuate groove A11 is formed with the arc terminating point E24 located in the lower part of the arcuate groove B12 as the center, as well as the arcuate groove Ab22.

Figure 7:
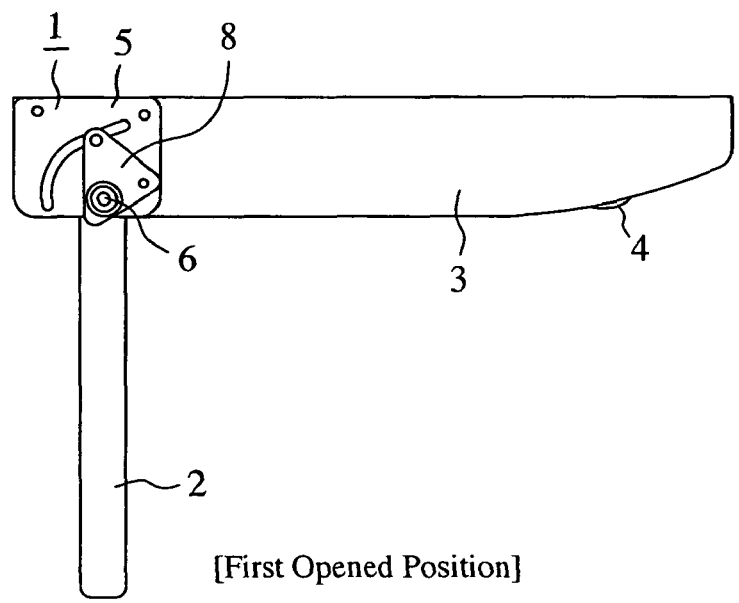
FIG. 7(a) is a front view of the apparatus body in the state where the center of rotation of the monitor is being switched.
FIG. 7(b) is a front view showing in an enlarged manner the monitor opening and closing mechanism in FIG. 7(a).
Figure 7:
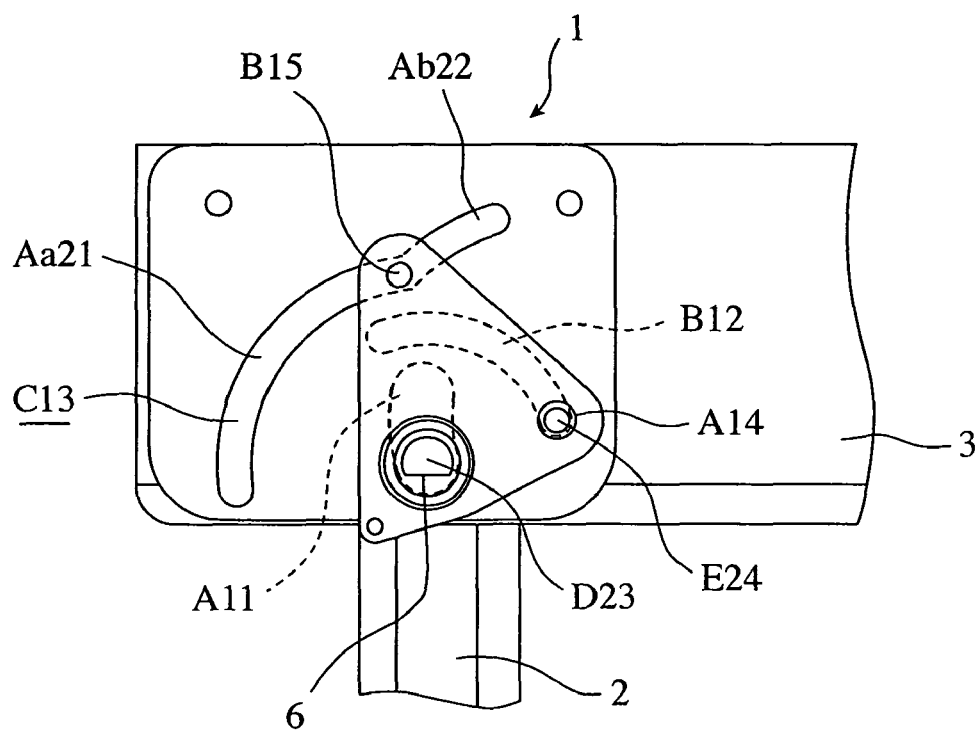
Figure 8:
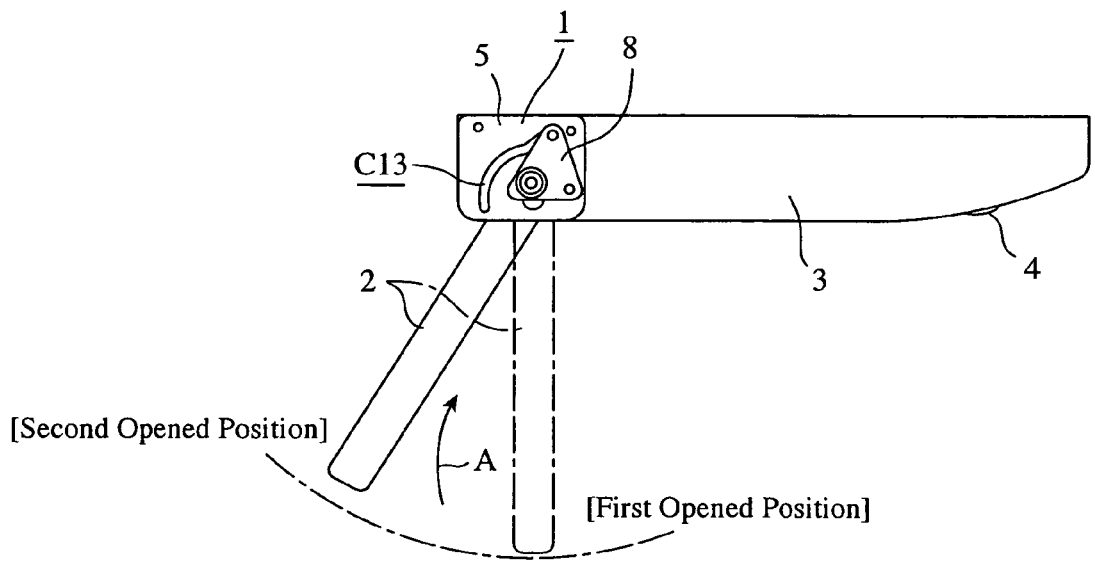
FIG. 8(a) is a front view of the apparatus body in the state where the monitor finished off rotation up to a predetermined position.
FIG. 8(b) is a front view showing i in an enlarged manner the monitor opening and closing mechanism in FIG. 8(a)
Figure 8:
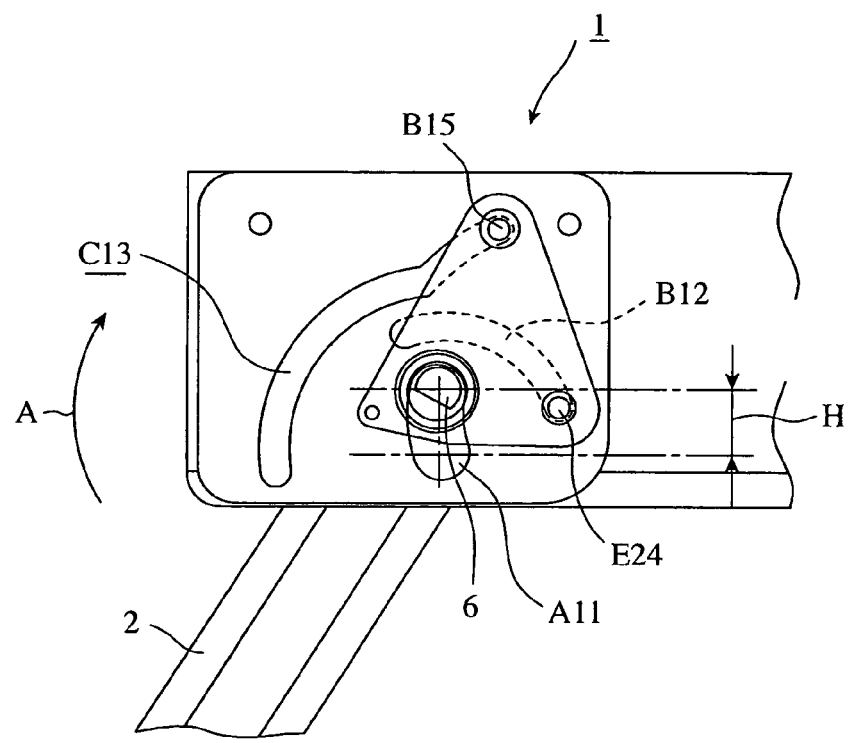

The operation thereof will be described by referring to FIGS. 6-8.

FIG. 6(a) illustrates the monitor 2 in the home position where the monitor is accommodated within the apparatus body 3; FIG. 7(a) illustrates the state where the center of rotation of the monitor 2 is being switched; and FIG. 8(a) illustrates the state where the monitor 2 finished the rotation up to the predetermined position established as the maximum opening angle where a user can see and listen to the monitor, respectively. The monitor opening and closing mechanisms 1 shown in those figures are in enlarged dimension shown in FIG. 6(b), FIG. 7(b), and FIG. 8(b), respectively.

1. Operation from the home position to the first opened position.

When the monitor 2 is placed in the home position where the monitor is housed within the apparatus body 3, as shown in FIG. 6(a) and FIG. 6(b), the plate projection A14 is located at the end portion of the anti-clockwise side of the arcuate groove B12, the plate projection B15 is located at the end portion of the anti-clockwise side of the arcuate groove C13, and the shaft 6 is located in the lower position of the arcuate groove A11, respectively.

Upon opening the monitor from that position by applying an external force thereon, the monitor 2 begins rotation and opening with the arc datum point D23 as the center of rotation, while the plate projection A14 begins slide and rotation with the arcuate groove B12 as the guide and the plate projection B15 begins slide and rotation with the arcuate groove C13 (the arcuate groove Aa21 in particular) as the guide.

As shown in FIG. 7(a) and FIG. 7(b), when the monitor rotated up to a certain angle (this position is referred to as a first opened position), the plate projection A14 abuts against the terminal of the arcuate groove B12, and the monitor becomes unable to further rotate with the arc datum point D23 as the center of rotation. At that time, the plate projection B15 exists in the boundary position between the arcuate groove Aa21 and the arcuate groove Ab22 in the arcuate groove C13. It should be understood that the plate projection A14, the plate projection B15, the arcuate groove B12, and the arcuate groove C13 are given only as one example of the first guide means for guiding the monitor 2 to rotate from the home position to the first opened position.

2. Operation from the first opened position to the second opened position.

Upon further applying an external force on the monitor 2 existing in the first opening state, the monitor now begins rotation and opening with the arc terminal E24 of the base 5 as the center of rotation, while the shaft 6 begins slide and rotation with the arcuate groove A11 as the guide and the plate projection B15 begins slide and rotation with the arcuate groove Ab22 positioned in the arcuate groove C13 as the guide.

When the monitor rotated to a further opened angle (this position is referred to as a second opened position) as shown in FIG. 8(a) and FIG. 8(b), the shaft 6 abuts against the upper terminal of the arcuate groove A11 and the plate projection B15 abuts against the terminal of the arcuate groove Ab22 positioned in the arcuate groove C13, and the monitor becomes unable to further rotate with the arc terminal E24 as the center of rotation. It should be noted that the plate projection B15, the shaft 6, the arcuate groove A11, the arcuate groove Ab22 located in the arcuate groove C13, and so on are given only as one example of the second guide means for guiding the monitor 2 to rotate from the first opened position to the second opened position.

In this example, the center of rotation (the arc terminal E24) on the rotation by the guide of the second guide means is disposed nearer to the side of the rotation starting position (the side of the home position) of the monitor 2, that is, in a lateral position, rather than the center of rotation (the arc datum point D23) upon the rotation by the guide of the first guide means. In such a way, the monitor 2 rotates so as to shift in the direction of the apparatus body 3 (in the direction of A). As shown in FIG. 8(b), the shaft 6 is displaced by a distance H from the lower end of the arcuate groove A11 to the upper end thereof, and correspondingly, as shown in FIG. 8(a), the lower end of the monitor 2 is also shifted by a distance equivalent to the distance H.

The position in the apparatus body 3 where the monitor 2 is accommodated is on the surface side of the apparatus body 3; however, when the monitor 2 is rotated up to the second opened position, the position of the center of rotation thereof is displaced as the monitor is opened, and the monitor 2 partially enters the apparatus body 3. Consequently, the monitor 2 reduces in the amount of its projection, and the rearward visibility can be increased by an amount equivalent to the amount of that displacement, which enables the employment of a large-scale monitor while ensuring safety.

Figure 15:
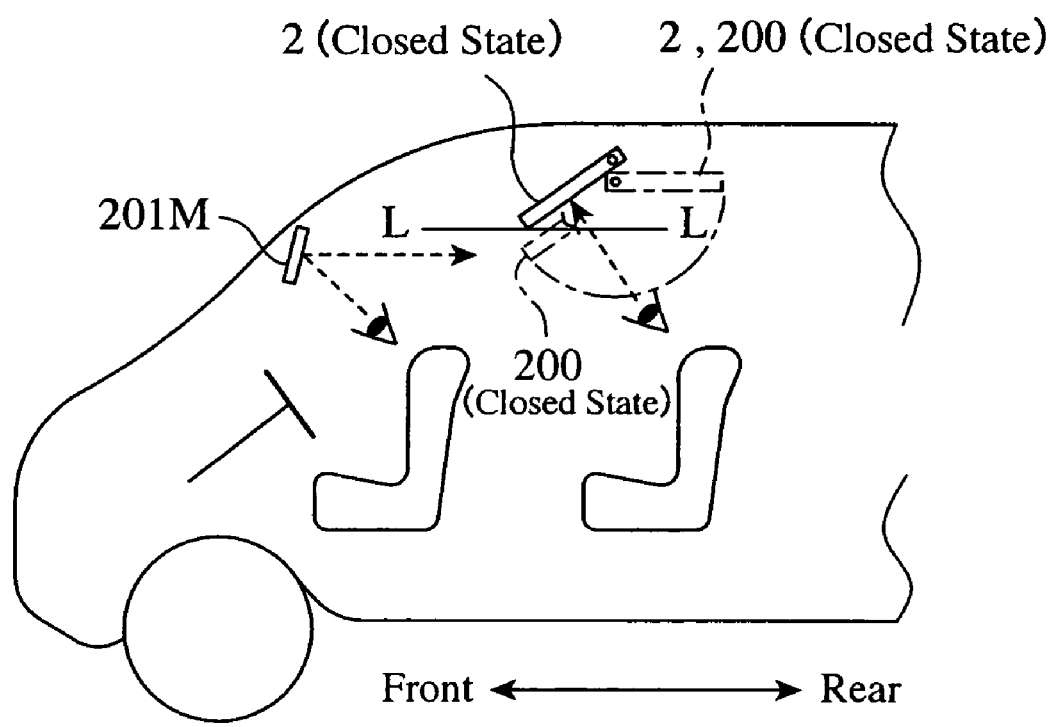
FIG. 15 is a view illustrating that the monitor in the opened position does not obstruct the rearward visibility through a room mirror.

As shown in FIG. 15, as compared to a monitor 200 with a conventional hinge mechanism where a monitor rotates about the center of rotation that is fixed, in the monitor 2 in accordance with this embodiment, the level L-L of the lower end of the monitor in the opened state where the angle thereof is suitable for viewing is retracted from the view through a room mirror 201M, which enables a vehicle to be securely operated. Moreover, this allows the employment of a large monitor. Besides, a space in a vehicle can be saved, which increases the design flexibility thereof.

It should be understood that the rotation resistance of the shaft 6 is properly established in consideration of the self-weight moment of the monitor, which enables the degree in which the monitor 2 is opened to be freely select and thereby enables the opening position thereof to be manually adjusted and the monitor to be held at the position.

The first embodiment thus arranged as mentioned above permits the entire monitor apparatus to be made compact and allows the monitor to be accommodated within the apparatus body 3 by arranging the first guide means and the second guide means by using circularly arcuate guide sections each having the shape of combined concentric circles without using a complicated hinge mechanism.

Second Embodiment

The second embodiment has the same constituent parts as those of the first embodiment, and the second embodiment differs from the first one in that the second embodiment allows the monitor to open further with the second opened position as the datum point and includes a return mechanism for returning the monitor to the datum point by using the action of an external force.

The monitor opening and closing mechanism 1' according to the second embodiment will be explained by using FIGS. 9-14. Remark parenthetically, the identical members and members having the identical functions are designated by the same reference numerals as those of the first embodiment.

Figure 9:
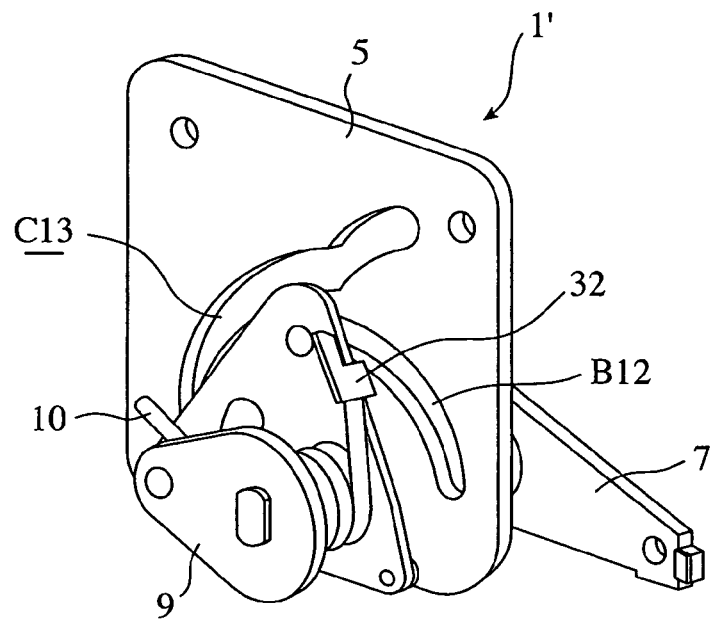
FIG. 9 is a perspective view of the structure of the monitor opening and closing mechanism having a return mechanism attached thereto as seen from the outside of the monitor.
Figure 10:
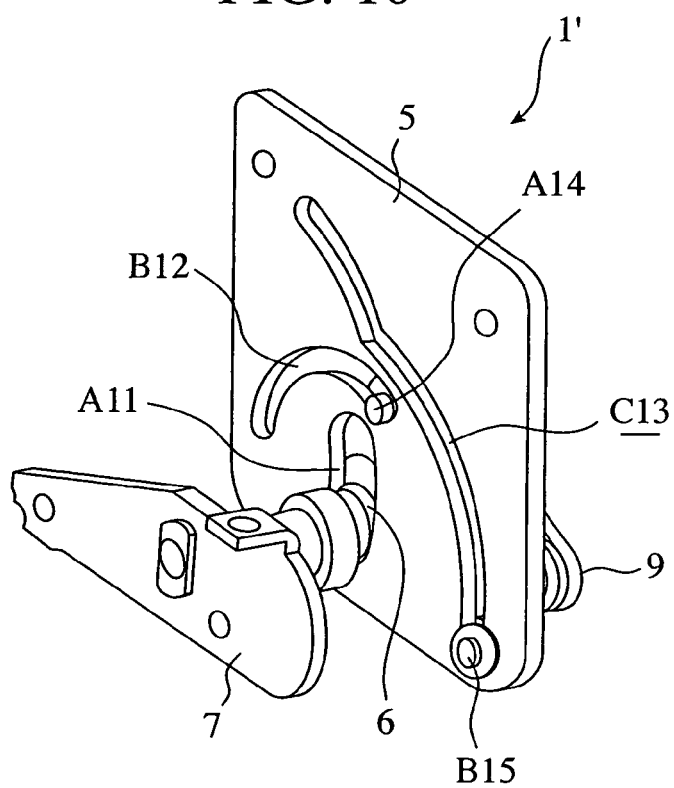
FIG. 10 is a perspective view of the structure of the monitor opening and closing mechanism having the return mechanism attached thereto as seen from the side of the monitor.
Figure 11:
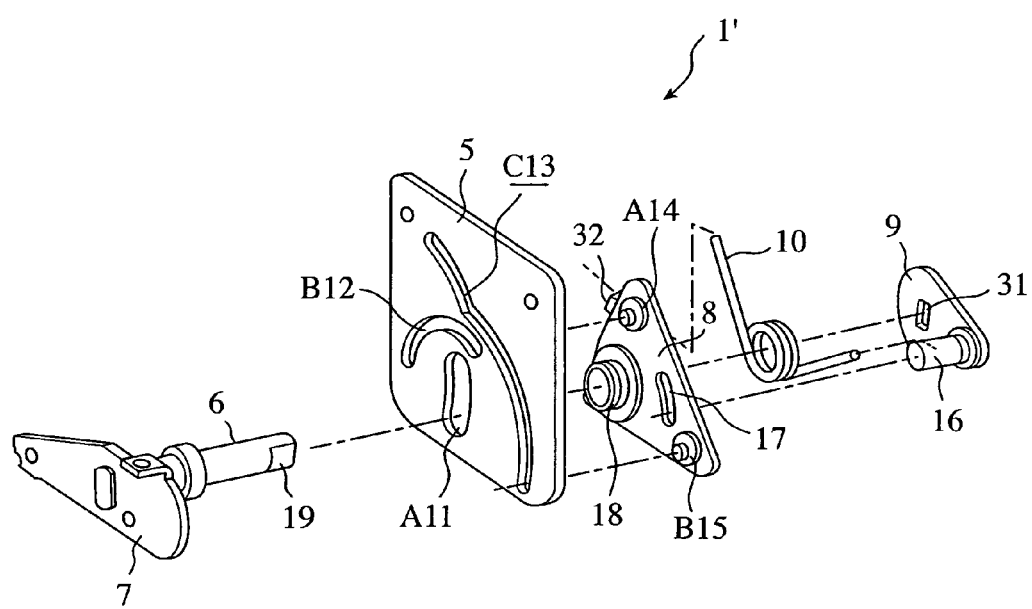
FIG. 11 is an exploded perspective view of the monitor opening and closing mechanism having the return mechanism attached thereto.

The structure of the monitor opening and closing mechanism 1' will be described with reference to FIG. 9 viewed from the outside of the monitor 2, FIG. 10 viewed from the side of the monitor 2, and FIG. 11 showing the mechanism in a disassembled state.

The shaft 6 is passed through each of the arcuate groove A11 of the base 5, the plate shaft 18 and the coil portion of a torsion spring 10, and the shaft is fit into and secured to a D cut hole 31 of an arm 9. To be more specific, the D cut hole 31 of the arm 9 is formed so as to have a D-shaped hole 31 of the same shape as that of the D cut 19 of the shaft 6, and the monitor base 7 to which the monitor 2 is secured and the arm 9 unitarily rotate. The plate 8 is provided with the plate projection A14 and the plate projection B15 that engage in the arcuate groove B12 and the arcuate groove C13 of the base 5, respectively, as similarly shown in the first embodiment, and the plate 8 is regulated in operation by the arcuate grooves A11, B12, C13 formed through the base 5, and soon. Furthermore, the arcuate groove C13 includes arcuate grooves Aa and Ab, as similarly shown in the first embodiment.

The plate 8 is provided with a plate arcuate groove 17 engaging with an arm projection 16 provided on the arm 9, and the arm 9 is arranged to be able to rotate within the range of the plate arcuate groove 17 of the plate 8. Moreover, the arms of the torsion spring 10 are hooked over a spring hook 32 of the plate 8 and the arm projection 16 of the arm 9, respectively, and since the arm 9 is energized in one direction by the spring force, the arm 9 and the plate 8 unitarily move as long as an external force exceeding the spring force is not exerted against the direction of action of the spring. The spring force at that time is arranged to be larger than the torque for rotating the monitor 2.

Figure 12:
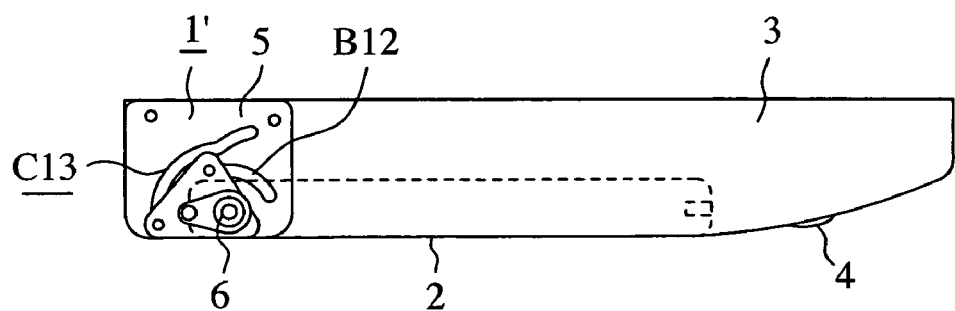
FIG. 12(a) is a front view of the apparatus body accommodating the monitor.
FIG. 12(b) is a front view showing in an enlarged manner the monitor opening and closing mechanism shown in FIG. 12(a).
Figure 12:
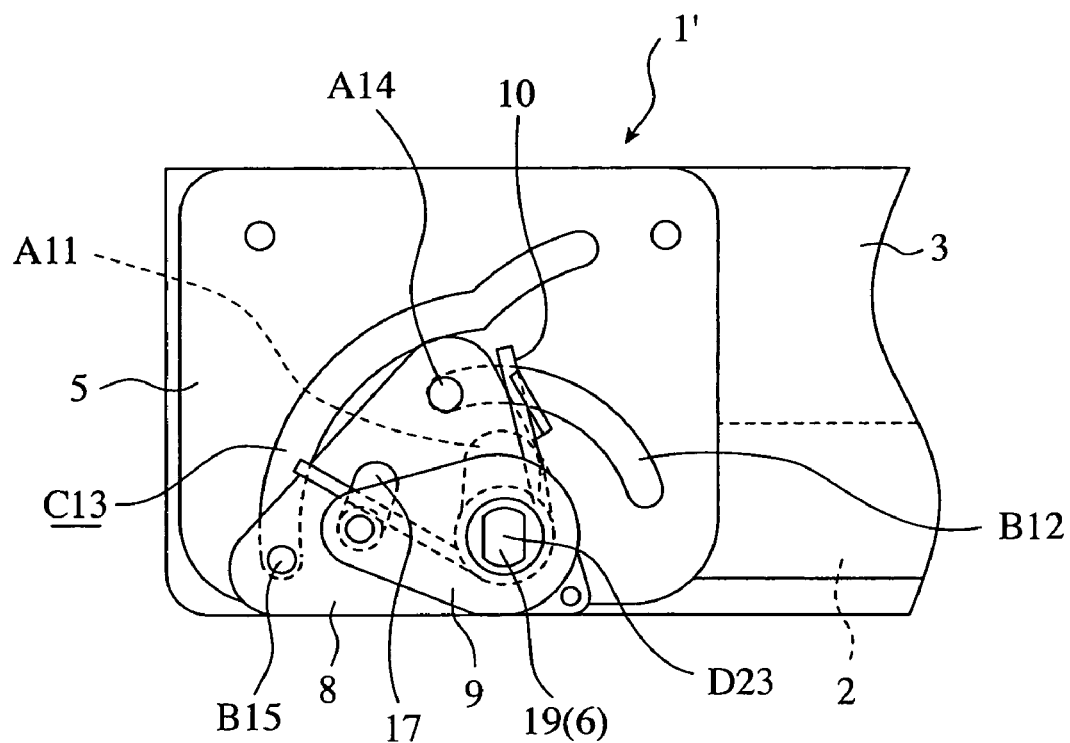
Figure 13:
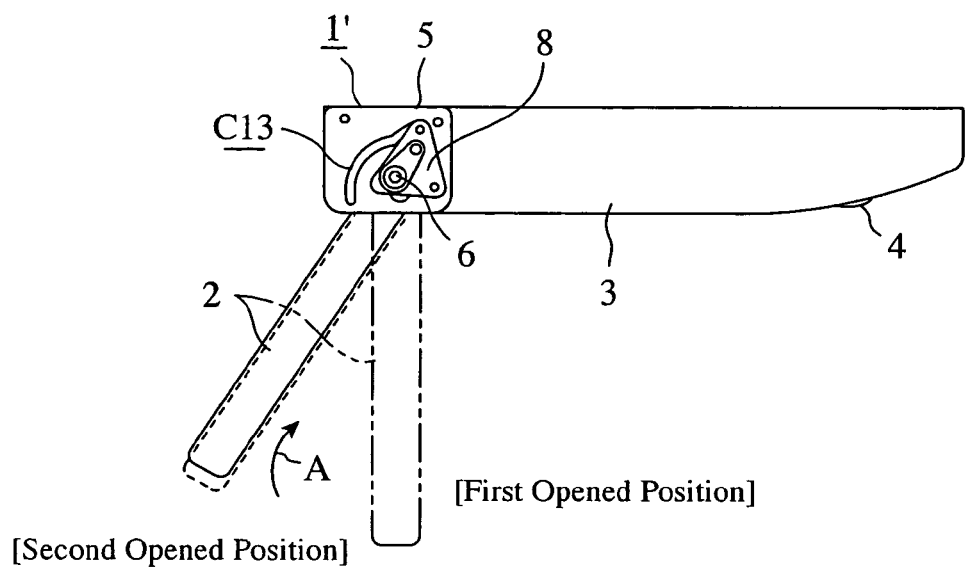
FIG. 13(a) is a front view of the apparatus body in the state where the monitor has rotated to a predetermined position.
FIG. 13(b) is a front view showing in an enlarged manner the monitor opening and closing mechanism shown in FIG. 13(a).
Figure 13:
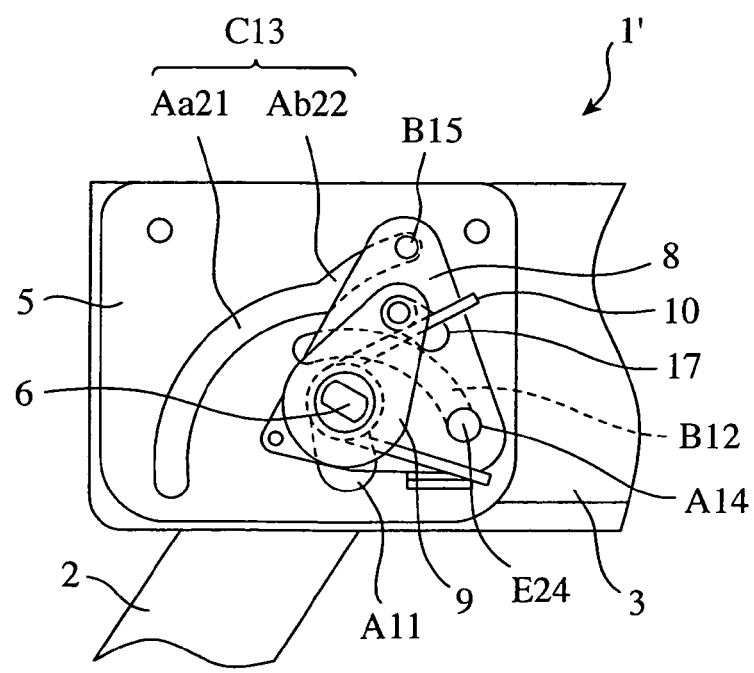
Figure 14:
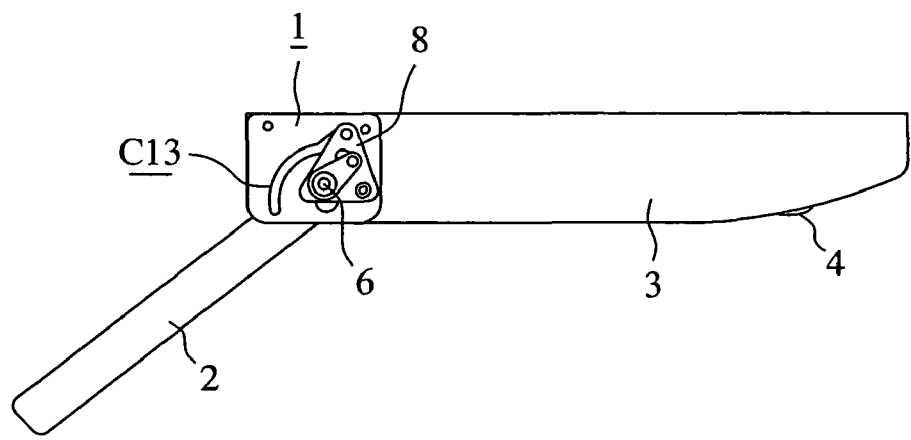
FIG. 14(a) is a front view of the apparatus body in the state where the monitor has rotated further from the predetermined position.
FIG. 14(b) is an front view showing in an enlarged manner the monitor opening and closing mechanism in FIG. 14(a).
Figure 14:
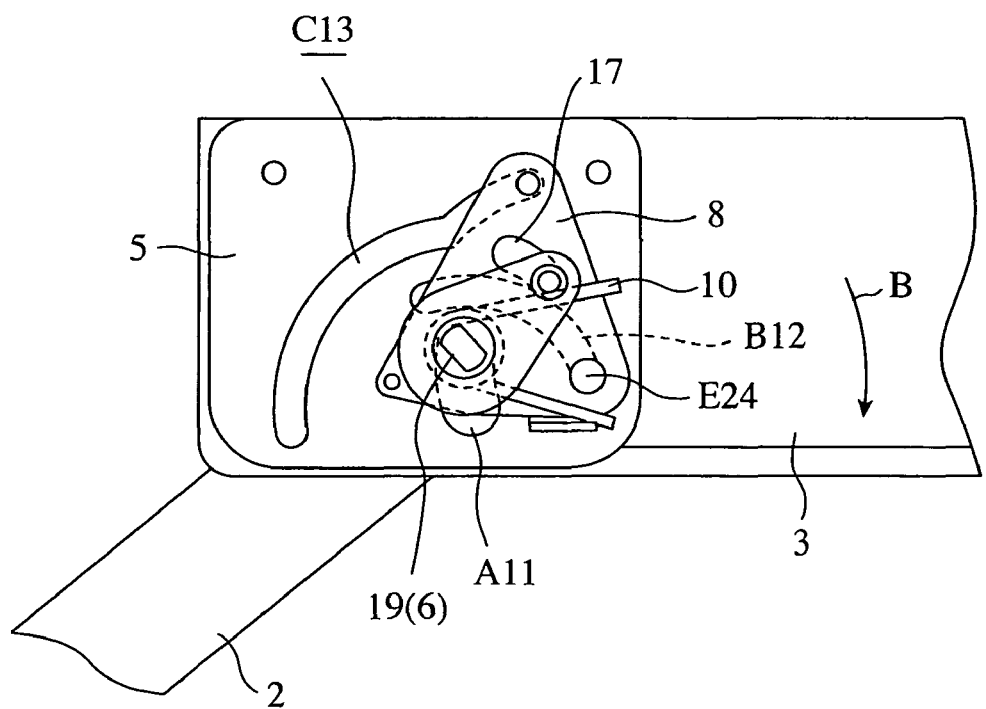

The operation thereof will be described by referring to FIGS. 12-14.

FIG. 12(a) illustrates the state where the monitor 2 exists in the home position where the monitor is housed within the apparatus body 3; FIG. 13(a) illustrates the state where the monitor 2 finished off rotation up to a predetermined position established as the maximum opening angle where a user can see and listen to the monitor; and FIG. 14(a) illustrates the state where the monitor 2 further rotates exceeding the predetermined position established as the maximum opening angle where a user can see and listen to the monitor, respectively. The monitor opening and closing mechanisms 1 shown in those figures are in enlarged dimension shown in FIG. 12(b), FIG. 13(b), and FIG. 14(b), respectively.

1. Operation from the home position via the first opened position to the second opened position.

Upon beginning opening the monitor 2 by exerting an external force on the monitor existing in the home position where the monitor is accommodated in the apparatus body 3 (see FIG. 12(a) and FIG. 12(b)), the plate projection A14 and plate projection B15 provided on the plate 8 begin rotation with the arcuate groove B12 and arcuate groove C13 provided through the base 5 as the sliding grooves, thus causing the monitor 2 to begin rotation with the arc datum point D23 of the base 5 as the center of rotation.

Referring to FIG. 13(a) and FIG. 13(b), when the monitor 2 received an external force exerted thereon and was rotated up to the first opened position, the plate projection B15 exists at the boundary position between the arcuate groove Aa21 and the arcuate groove Ab22 in the arcuate groove C13. And at that time, the plate projection A14 abuts the terminal of the arcuate groove B12, and on this account, the monitor cannot further rotate with the arc datum point D23 as the center of rotation. Therefore, the monitor now begins rotation with the arc terminal E24 of the base 5 as the center of rotation. That rotation carried out with the arc terminal E24 as the center of rotation is continued until the plate projection B15 abuts against the terminal of the arcuate groove Ab22 (at the same time, the shaft 6 abuts against the upper end of the arcuate groove A11). The rotation position at that time is referred to as the second opened position.

Since in the rotation carried out from the first opened position to the second opened position, as with the first embodiment, the center of rotation (the arc terminal E24) used when the monitor rotates by the guide of the second guide means (the plate projection B15, the shaft 6, the arcuate groove A11, and the arcuate groove Ab22 located in the arcuate groove C13) is disposed more nearly to the side of the rotation starting position (the side of the home position) of the monitor 2, to say more exactly, in a more lateral position, than the center of rotation (the arc datum point D23) used when the monitor rotates by the guide of the first guide means (the plate projection A14, the plate projection B15, the arcuate groove B12, the arcuate groove C13, and so on) is disposed, the monitor 2 rotates so as to shift in the direction of the apparatus body 3 (in the direction of A).

In such a way, also in the second embodiment, as with the first embodiment explained by referring to FIG. 15, the advantages of the monitor's being displaced in the direction where the monitor 2 reduces in the amount of projection thereof and thereby, not obstructing the rearward visibility through a room mirror can be obtained.

2. Further opening operation with the second opened position as the datum point.

This embodiment allows the monitor 2 to rotate exceeding the second opened position. Thus, upon causing the monitor to rotate over the second opened position, the plate 8 cannot move because of having rotated up to the terminal of the arcuate groove A11 provided through the base 5; however, the arm 9 energized in one direction by the spring force of the torsion spring 10 rotates this time with the shaft 6 as the center while receiving the spring force of the torsion spring 10 together with the monitor 2 (see FIG. 13 and FIG. 14).

Since on the monitor 2, is exerted a torque in the direction opposite to the rotatable direction by the spring force of the torsion spring 10, a user can sensuously find that the rotation of the monitor 2 has exceeded the predetermined position (the second opened position) from a tactile feedback of manual operation, for instance. Moreover, since in that rotation, the monitor 2 rotates with the shaft 6 fixed on the top end of the arcuate groove A11 as the fixed center of rotation, the monitor 2 does not shift to the side of the apparatus body 3, and since the monitor rotates in the B direction that is the anti-clockwise direction centered about the shaft 6, the monitor 2 does not abut against the bottom surface of the apparatus body 3. Furthermore, if the external force exerted on the monitor 2 is released in such a manner as to separate the hand from the monitor, after the monitor 2 is rotated exceeding the predetermined position (second opened position), the monitor 2 returns to the predetermined position (second opened position) by the spring force of the torsion spring 10. Thus, a user, when opening the monitor 2, releases the external force in the proper position where the user feels by a tactile feedback that the monitor has exceeded the second opened position, which enables the user to automatically locate the monitor 2 in the second position suitable for seeing and listening.

The arm 9, the torsion spring 10, and the plate arcuate groove 17, which serve such a function, constitute the main members of a returning mechanism for performing the function of returning the monitor 2 exceeding the second opened position to the second opening position. Besides, even if an object or a person mistouches the monitor 2 existing in the second opened position, the returning mechanism causes the monitor to further rotate to thereby absorb the shock, and then causes the monitor 2 to automatically return to the original position.

INDUSTRIAL APPLICABILITY

As mentioned above, the monitor opening and closing mechanism according to the present invention, which holds a monitor at an angle suitable for a user to see and listen when the monitor is used, and further, causes the monitor not to obstruct a driver's rearward visibility through a room mirror, is suitable for use in mechanisms for in-vehicle monitors mounted on a ceiling of a motor vehicle or the like.

The invention claimed is:

1. A monitor opening and closing mechanism that openably and closably supports a monitor suspended from a ceiling and switches a plurality of centers of rotation of the monitor according to the degree in which the monitor is opened, said mechanism comprising:
    a first guide unit configured to guide the monitor to rotate from a home position to a first opened position, where the home position makes the monitor horizontal against the ceiling to house the monitor in an apparatus body, the first guide unit including:
        a first arcuate slot and a second arcuate slot each formed around a point as a center,
        a first plate projection configured to slide within the first arcuate slot, and
        a second plate projection configured to slide within the second arcuate slot; and a second guide unit configured to guide the monitor to rotate from the first opened position to a second opened position where the monitor is further opened, the second guide unit including:
a third arcuate slot and a fourth arcuate slot each formed around a point as a center, where the point corresponds to a position of the second plate projection in the first opened position,
the first plate projection configured to slide within the third arcuate slot, and
a shaft configured to slide within the fourth arcuate slot,
wherein the center of rotation upon the rotation guided by the second guide unit is disposed nearer to a position where the monitor is housed in the apparatus body than the center of rotation upon the rotation guided by the first guide unit, and
the point as the center of the first and second arcuate slots corresponds to a position of the shaft in the first opened position.

2. The monitor opening and closing mechanism according to claim 1, wherein the first guide unit and the second guide unit each include a circularly arcuate guide section and a movement section moving along the guide section.

3. The monitor opening and closing mechanism according to claim 1, wherein the third arcuate slot is formed to connect with the first arcuate slot.

4. The monitor opening and closing mechanism according to claim 1, further comprising a return mechanism configured to allow the monitor to further open beyond the second opened position as a datum point when an external force acts on the monitor, and configured to return the monitor to the second opened position when the external force is released.

5. The monitor opening and closing mechanism according to claim 4, wherein the return mechanism includes:
an arm section configured to rotate integrally with the monitor,
an arcuate slot formed to be slidden therein an arm projection of the arm section, and
a torsion spring hooked over both the arm projection and a spring hook of a plate having the arcuate slot.

* * * * *